United States Patent [19]
Payne et al.

[11] Patent Number: 6,057,598
[45] Date of Patent: May 2, 2000

[54] FACE ON FACE FLIP CHIP INTEGRATION

[75] Inventors: Robert L. Payne, San Jose; Herbert Reiter, Los Altos, both of Calif.

[73] Assignee: VLSI Technology, Inc., San Jose, Calif.

[21] Appl. No.: 08/794,272

[22] Filed: Jan. 31, 1997

[51] Int. Cl.[7] .................................................. H01L 23/34
[52] U.S. Cl. ........................ 257/723; 257/777; 257/778
[58] Field of Search ................................... 257/777, 778, 257/737, 738, 723

[56] References Cited

U.S. PATENT DOCUMENTS

| | | | |
|---|---|---|---|
| 5,773,896 | 6/1998 | Fujimoto et al. | 257/777 |
| 5,777,345 | 7/1998 | Loder et al. | 257/777 |

OTHER PUBLICATIONS

Gwennap, Linley, "NeoMagic Puts Graphics System in One Chip," Microprocessor Report, Mar. 6, 1995, pp. 20–21.
"Introduction to SmartMUMPs," EDT, Jul. 3, 1996.
D'Ignazio, John et al., "Assembly & Packaging News," prior to Nov. 30, 1996.

*Primary Examiner*—Carl Whitehead, Jr.
*Assistant Examiner*—Roy Potter
*Attorney, Agent, or Firm*—Hickman Stephens & Coleman, LLP

[57] ABSTRACT

The present invention provides methods and apparatus capable of efficiently combining a logic circuit die with a memory circuit die in a single integrated circuit device capable of supporting memory intensive applications, such as 3-dimensional graphics rendering, encryption and signal processing. The logic circuit die is produced independently with a logic circuit fabrication process that optimizes the logic circuit's performance and reduces costs, and the memory circuit die, which may contain a large memory circuit, can be produced independently with a memory circuit fabrication process that optimizes the memory circuit's performance and reduces costs. The circuit dies are attached directly together in a flip-chip fashion to create a unitary integrated circuit assembly having a high-performance, low impedance, wide-word interface. This integrated circuit assembly can be enclosed within a typical integrated circuit package for insertion on a circuit board, such as those used in personal computers and other common electronic applications.

36 Claims, 4 Drawing Sheets

FACE ON FACE FLIP CHIP INTEGRATION

BACKGROUND

The present invention relates generally to the manufacture of integrated circuits, and more specifically to methods and apparatus for efficiently combining an extensive logic circuit with a large memory circuit.

Logic circuits and memory circuits are typically manufactured with different processes designed to optimize these respective circuit types. For example, a memory circuit, such as a DRAM, is typically optimized by using a low leakage but also low performance transistor and special high density storage capacitor elements interconnected with two layers of metal. Conversely, logic circuits tend to be optimized when constructed with higher performance transistors and minimized capacitance. Also, logic circuits typically include more than two layers of metal.

It is possible to create a memory circuit with a logic circuit process, however the resulting circuit would not be optimized for the memory function. Typically, DRAM is created by a logic process that has about $1/8$ to $1/10$ the density and a shorter data retention time than that which is achievable with a DRAM process. Conversely, it is also possible to create a logic circuit with a DRAM process, however the logic circuit will typically be about $1/4$ the density of that achievable with a logic process.

FIGS. 1a and 1b illustrate the inefficiencies encountered in the prior art of combining memory and logic circuits together utilizing a single process. FIG. 1a depicts a typical hybrid integrated circuit 10 manufactured with a logic circuit process combining a memory circuit 12 and a logic circuit 14 on a single substrate surrounded by a number of bonding pads 16. Similarly, FIG. 1b depicts a typical hybrid integrated circuit 20 manufactured with a memory circuit process combining a memory circuit 22 and a logic circuit 24 on a single substrate surrounded by a number of bonding pads 16.

Assuming that both integrated circuits 10 and 20 represent the same amount of memory and logic circuitry, the inefficiency of the non-process related circuitry is represented by the differences in area occupied by the circuitry. For example, the area required for memory circuit 12, created with a logic process, is much greater than the area required for memory circuit 22, created with a memory process. Likewise, the area required for logic circuit 24, created with a memory process, is much greater than the area required for logic circuit 14, created with a logic process.

For logic circuits that do not require a large memory capability, e.g., only a few kilobytes of memory, the logic process may suffice for both the logic and memory functions. Similarly, for memory circuits that require only a small logic capability, for example an input/output capability, the memory process may suffice for both the memory and logic functions. However, for circuits that require both a large memory capability and an extensive logic capability, neither the memory nor logic processes are adequate for effectively producing both memory and logic circuits.

For example, NeoMagic of Santa Clara, Calif. has produced a hybrid graphics chip under the trademark MagicGraph NM2070 using a 16M DRAM process to implement both logic and memory on a single chip. This costly approach appears technically adequate so long as the logic complexity is low in comparison to the memory size. However, a device such as this would likely be less than optimal whenever the logic complexity is high relative to the memory size.

In typical applications large memories and large logic circuits are configured as discrete parts. For example, separate memory chips are often configured to act as a frame buffer for a logic circuit. However, by separating memory and logic functions, device count is increased, circuit board size is increased, and performance issues due to increased pin counts and interconnections tend to increase. Performance is further limited by the typically narrow-word interfaces to the memory circuit, such as the 32-bit wide interface typically found in notebook computer systems and the 64-bit wide interface found in some desk-top computer systems. For memory intensive applications, such as 3D graphics rendering applications, the narrow-word interface of a conventional separate frame buffer tends to increase both the complexity and cost of the system.

In view of the foregoing, what is desired are methods and apparatuses capable of efficiently combining an extensive logic circuit with a large memory circuit in a single device.

SUMMARY

The present invention provides methods and apparatus capable of efficiently combining a logic circuit die with a memory circuit die in a single integrated circuit device.

In accordance with the present invention, a logic circuit die is produced with a logic circuit fabrication process that optimizes the logic circuit's performance and reduces costs. Likewise, a memory circuit die is produced with a memory circuit fabrication process that optimizes the memory circuit's performance and reduces costs. The two circuit dies are then attached directly together, adjacent or "face-to-face", in a flip-chip fashion to create a unitary integrated circuit assembly having a wide-word, low impedance interface between the logic circuit and the memory circuit. This integrated circuit assembly can be enclosed within a standard integrated circuit package having conductive leads for connecting the resulting integrated circuit device to a circuit board or the like.

The present invention provides an efficient and inexpensive integrated circuit assembly capable of supporting memory intensive applications, such as 3D applications, via the wide-word interface. Such applications have been difficult and costly to achieve with a conventional separate frame buffer using narrow-word interfaces. As a result, the present invention can be applied in advanced and future generations of set top boxes, personal digital assistants, encryption devices, and signal processing devices that require ever higher performance via frame buffering. Furthermore, an integrated circuit device created in accordance with the present invention will have a package pin (i.e., conductive lead) count which is significantly lower than a typical graphics circuit chip with a frame buffer interface.

In addition to increased performance and reduction in size, the present invention also provides for reduced costs and increased production. For example, unlike the typical hybrid circuits, the present invention allows for identification of memory and logic circuit die fabrication failures prior to attaching the two dies together. Thus, a memory circuit die failure will not require that the logic circuit die be discarded as well, and similarly logic circuit die fabrication failures will not require that the memory circuit die be discarded. With the present invention, a logic wafer containing a plurality of logic circuit dies, can be probed and tested to identify good and bad logic circuit dies and pre-tested memory circuit dies could be attached to the good logic circuit dies while still in logic wafer form, allowing the logic wafer to be processed for assembly into traditional packages, with memory circuit dies already in place.

The present invention relates to, in one embodiment, an integrated circuit assembly and method for making the integrated circuit assembly. The integrated circuit assembly comprising a first circuit die and a second circuit die being attached together, where the first circuit die is made with a first circuit fabrication process and the second circuit die is made with a second fabrication process. For example, the first circuit fabrication process may be a memory fabrication process, or an analog fabrication process, and the second fabrication process can be a logic fabrication process. Regardless of the fabrication process, both of the circuit dies will include a plurality of conductive contacts arranged on one side or face of the die. The plurality of contacts on one, or both of the dies, is further provided with conductive bumps via conventional bumping techniques, such as solder, gold, or other bumping techniques.

During assembly, the circuit dies are positioned such that the sides of each circuit die, having the plurality of contacts and bumps, are significantly parallel to one another with the contacts and bumps sufficiently aligned and physically and electrically coupled together. Conventional attachment techniques associated with bump technologies are used to complete the interface between the circuit dies.

Following assembly, the circuit dies are thus interfaced together via a wide-word interface, such as a 128 bit, 256 bit, or greater-bit parallel interface. This wide-word interface provides for high speed data exchanges between the circuit dies.

The present invention also relates to an integrated circuit device having an integrated circuit assembly, as described above, further integrated with a plurality of conventional conducting leads coupled to bonding pads on one of the dies via bonding wires or like connectors. This integrated circuit device is then encapsulated in an conventional insulating package, such as plastic resin package, ceramic package, or other conventional package

BRIEF DESCRIPTION OF THE DRAWINGS

The invention, together with further objects and advantages thereof, may best be understood by reference to the following description taken in conjunction with the accompanying drawings in which.

DESCRIPTION

An invention is described for an apparatus and method for efficiently combining a large logic circuit with a large memory circuit through a face-on-face flip-chip integration. With the present invention, neither logic density nor memory density is compromised.

Figure 1A:
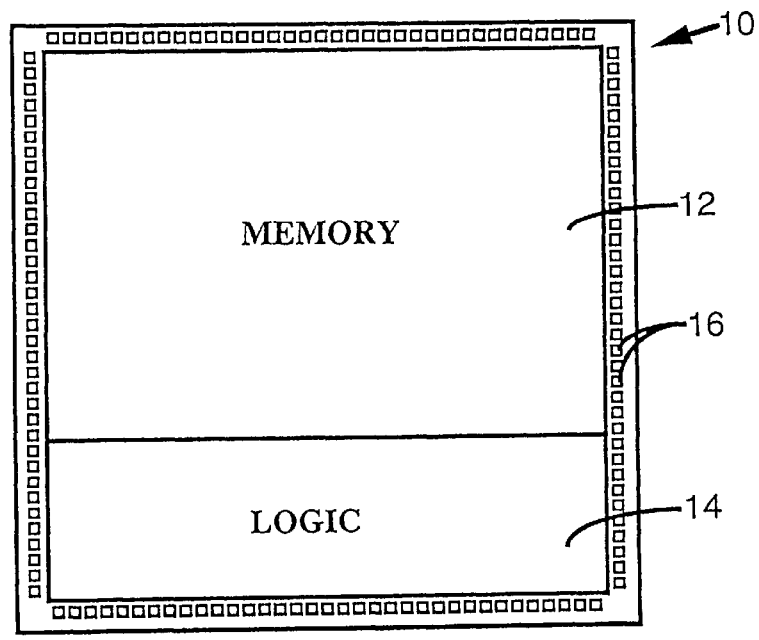
FIG. 1a is graphical representation of areas required for memory and logic circuitry on a prior art single die hybrid integrated chip fabricated with a logic process.
Figure 1B:
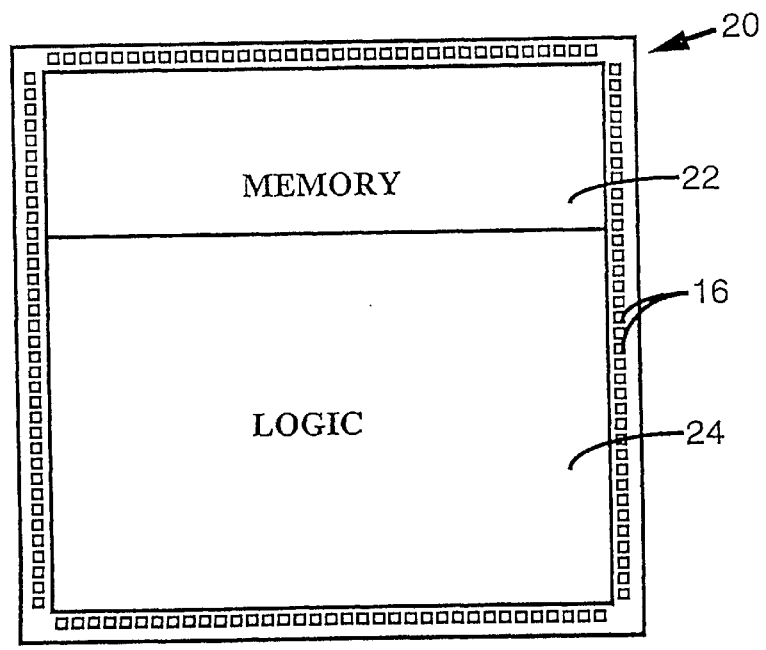
FIG. 1b is graphical representation of areas required for memory and logic circuitry on a prior art single die hybrid integrated chip fabricated with a memory process.
Figure 2A:
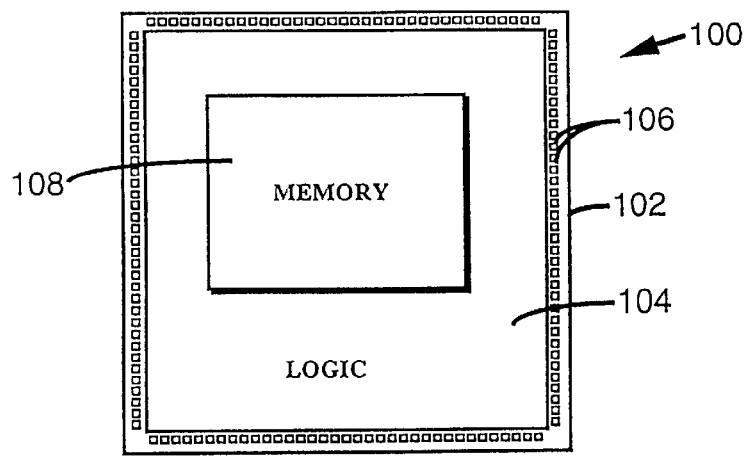
FIG. 2a illustrates the arrangement of a memory circuit die attached to a logic circuit die in accordance with the present invention.

FIG. 2a illustrates a preferred embodiment of the present invention in the form of an integrated circuit assembly 100. Integrated circuit assembly 100 includes a logic circuit die 102, having a logic circuit 104 created with a logic circuit fabrication process, and a plurality of bonding pads 106 for interfacing with logic circuit 104. Logic processes for making logic circuits is well known to those skilled in the art. Mounted on and electrically coupled to logic circuit die 102 is a memory circuit die 108 having a memory circuit (not shown) created with a memory circuit fabrication process. Memory processes for making memory circuits are well known to those skilled in the art.

Figure 2B:
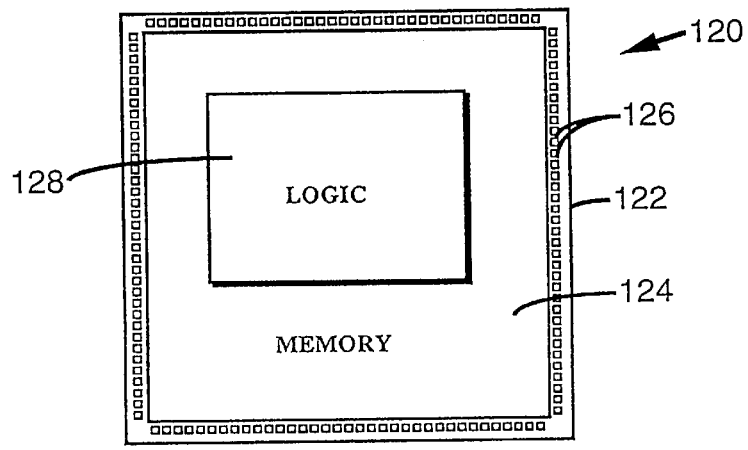
FIG. 2b illustrates the arrangement of a logic circuit die attached to a memory circuit die in accordance with the present invention.

FIG. 2b illustrates another embodiment of the present invention in the form of an integrated circuit assembly 120. Integrated circuit assembly 120 includes a memory circuit die 122, having a memory circuit 124 created with a memory circuit fabrication process, and a plurality of bonding pads 126 for interfacing with memory circuit 124. Mounted on and electrically coupled to memory circuit die 122 is a logic circuit die 128 having a logic circuit (not shown) created with a logic circuit fabrication process. Memory circuit 124 can be a dynamic random access memory (DRAM), static random access memory (SRAM), flash memory, or other equivalent digital memories.

Figure 2C:
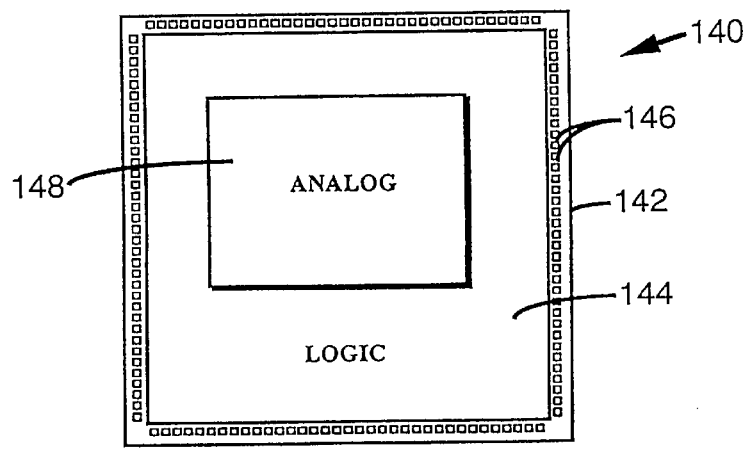
FIG. 2c illustrates the arrangement of an analog circuit die attached to a logic circuit die in accordance with the present invention.

FIG. 2c illustrates another embodiment of the present invention in the form of an integrated circuit assembly 140. Integrated circuit assembly 140 includes a logic circuit die 142, having a logic circuit 144 created with a logic circuit fabrication process, and a plurality of bonding pads 146 for interfacing with logic circuit 144. Mounted on and electrically coupled to logic circuit die 142 is an analog circuit die 148 created with a analog circuit fabrication process. Analog processes for making analog circuits is well known to those skilled in the art.

Figure 3A:
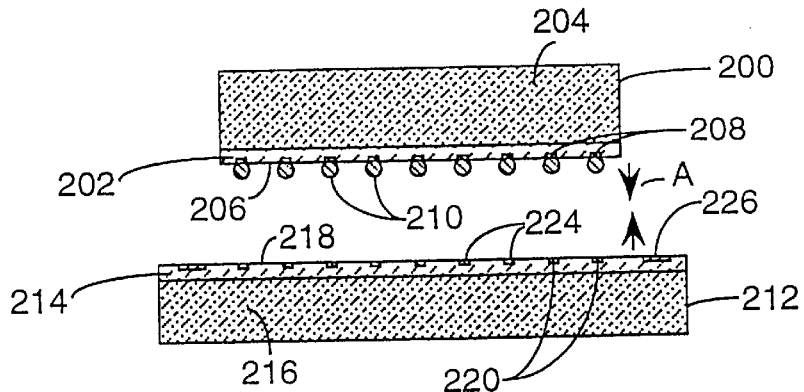
FIG. 3a is cross-section view of a memory circuit die and a logic circuit die prior to being attached together in accordance with one embodiment of the present invention.

FIG. 3a illustrates a preferred embodiment of a memory circuit die 200 having a memory circuit 202 created with a memory circuit fabrication process on a first substrate 204 (e.g., a silicon wafer) and forming a first connecting side 206. Memory circuit 202 is electrically coupled to a first plurality of conducting contacts 208 that extend from memory circuit 202. As shown, the first plurality of conducting contacts 208 are fitted with, or formed as, conductive bumps 210. FIG. 3a also illustrates a preferred embodiment of a logic circuit die 212 having a logic circuit 214 created with a logic circuit fabrication process on a second substrate 216 (such as a silicon wafer) and forming a second connecting side 218. Logic circuit 212 is electrically coupled to a second plurality of conducting contacts 220 that extend from logic circuit 214. As shown, the second plurality of conducting contacts 220 form pads 224. Additionally, logic circuit die 212 includes one or more bonding pads 226 which are electrically coupled to logic circuit 214 and extend through second insulating layer 222. Bonding pads 226 provide an interface to logic circuit 214.

Figure 3B:
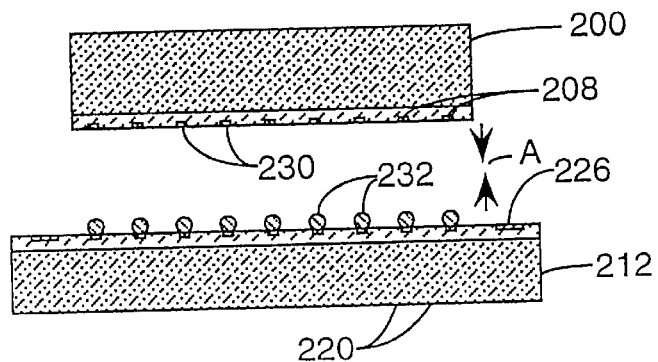
FIG. 3b is cross-section view of a memory circuit die and a logic circuit die prior to being attached together in accordance with another embodiment of the present invention.

FIG. 3b, which is similar to FIG. 3a, illustrates another preferred embodiment of a memory circuit die 200 and logic die 212 wherein the first plurality of conductive contacts 208 form pads 230, and wherein logic circuit die 212 has the second plurality of conducting contacts 208 fitted with, or formed as, conductive bumps 232. Of course, conductive bumps could be attached to both contacts 208 and contacts 220, or both contacts 208 and contacts 220 can be formed as bumps.

Figure 3C:
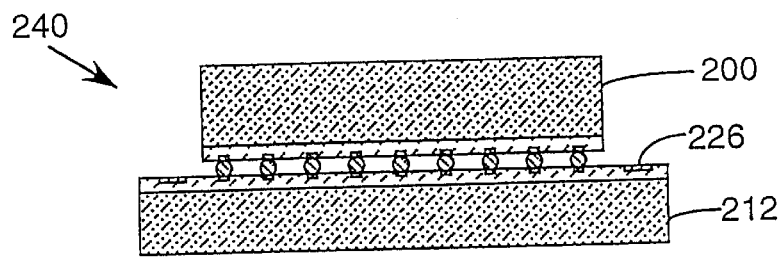
FIG. 3c is cross-section view of an integrated circuit assembly in accordance with the present invention.

The directional arrows A in FIGS. 3a and 3b are illustrative of the process that brings memory circuit die 200 and logic circuit die 212 together creating a physical and electrical coupling via conductive bumps (210 or 232) and pads (224 or 230). FIG. 3c illustrates the resulting preferred embodiment of the present invention in the form of an integrated circuit assembly 240. Integrated circuit assembly 240 includes memory circuit die 200 and logic circuit die 212.

Note that logic circuit die 212 is preferably larger than memory circuit die 200 so as to expose the plurality of bonding pads 226 around the periphery of the logic circuit 214 for wire bonding. Alternatively, memory circuit die 200 can be the larger die and can be provided with the exposed bonding pads for wire bonding. It is also recognized that both of the circuit dies can be provided with bonding pads for wire bonding.

Figure 4:
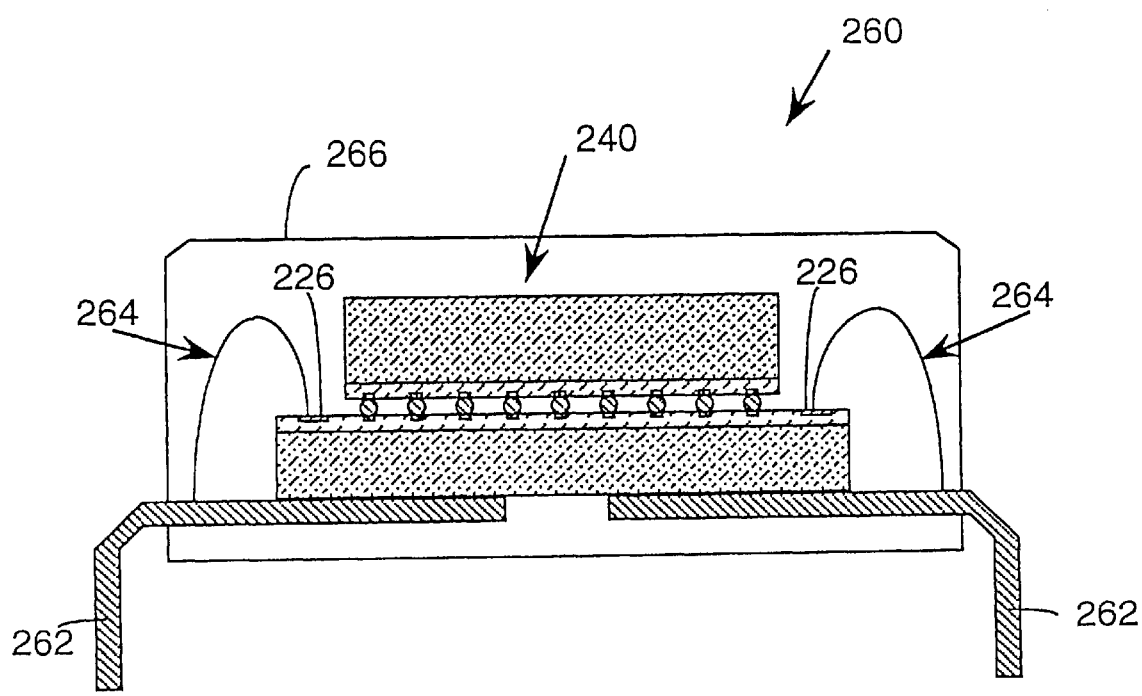
FIG. 4 is a cross-section view of an integrated circuit device in accordance with the present invention

FIG. 4 illustrates a cross-section view of an embodiment of the present invention in the form of an integrated circuit device 260. Integrated circuit device 260 includes integrated circuit assembly 240 electrically coupled to conductive leads 262 via bonding wires 264, and an insulating package 266 covering integrated circuit assembly 240, bonding wires 264 and a portion of conductive leads 262. Such a device 260 can be manufactured with leadframe bonding and plastic encapsulation, as well known to those skilled in the art.

A method of the present invention includes creating an integrated circuit assembly 240 by providing a memory circuit die 200 made with a memory circuit fabrication process, and a logic circuit die 212 made with a logic circuit fabrication process. The memory circuit die 212 has a first plurality of conductive contacts 208 arranged on a first connecting side 206 of memory circuit die 200, and a memory circuit 202 formed on the memory circuit die 200 and electrically coupled to the first plurality of conductive contacts 208. The logic circuit die 212 has a second plurality of conductive contacts 220 arranged on a second connecting side 218 of logic circuit die 212, and a logic circuit 214 formed on logic circuit die 212 and electrically coupled to the second plurality of connecting contacts 220.

The method further includes attaching the memory circuit die 212 and logic circuit die 200 together in a flip-chip fashion with first connecting side 206 being placed in close proximity to second connecting side 218 such that the first plurality of conductive contacts 208 is physically connected to second plurality of contacts 220 to provide electrically conductive connections between memory circuit 202 and logic circuit 214, thereby forming a unitary, integrated circuit assembly 240. Again, flip-chip bonding techniques are well known to those skilled in the art.

The method further includes enclosing integrated circuit assembly 240 within an insulating package 266, such as a polymer or ceramic package, and providing a plurality of conductive leads 262 that are electrically coupled to integrated circuit assembly 240, via bonding wires 264, or other conductive paths. A portion of conductive leads 262 extends outward from within insulating package 266. Conductive leads 262 can take the shape of any number of standard and typical packaging leads, such as pins, balls, posts, etc., so long as conductive leads 262 provide electrical input/output connectivity to integrated circuit assembly 240. Since the integrated circuit assembly includes the interconnections between the memory and logic circuits, the number of pins required of the packaged integrated circuit assembly is much reduced, with the advantage of lower costs and better performance.

The face-on-face flip-chip integrated circuit assembly of the present invention provides a wide-word interface between the logic circuit die and the memory circuit die. The minimal small interconnect length between the two circuit dies can support a very high speed interface for data exchanged between the logic circuit and the memory circuit due to the low intrinsic impedance of the interconnect. Furthermore, by using synchronous memory style interfacing such an assembly is expected to support well in excess of 100 MHz data rates between such circuits.

Preferably, the wide-word interface should be at least about 128 bits or 16 bytes, more preferably, about 256 bits or 32 bytes, or greater. Wide-word interfaces, such as a 32 byte wide-word interface, can support in excess of 3.2 G bytes/second data rates.

With such data rates and an appropriate amount of memory, the present invention can support standard displays and other 3-dimensional (3D) graphics rendering applications. For example, a 16 M bit memory circuit provides 2 M bytes of data. This is more than sufficient for a displays having a 1024×768 pixel resolution with 16 data bits per pixel (i.e., just over 1.57 M bytes). The remaining memory, almost 400K bytes, can be used as an additional cache. To support 3D graphics applications, a 64 M bit memory circuit or larger can be used, thereby providing for 8 M bytes or greater for display data.

Note that, only one of the two circuit dies need be bumped, i.e., provided with conductive bumps. However, both can be bumped. As used herein, "bumped" shall mean solder bumps, gold bumps, silver bumps and the like. Preferably, the memory circuit die is bumped using typical solder or gold bumping techniques, since logic circuit dies tend to be more difficult to test when bumped. Both solder and gold bumping technologies are known to those skilled in the art, solder bumping typically uses reflowing techniques, e.g., as developed by IBM Corporation of White Plains, N.Y., and gold bumping usually relies on ultra-sonic energy to make the connection, e.g., as developed by Aptos Corporation of San Jose, Calif. For the present invention, either bumping technology or similar technologies can be used. Furthermore, it is recognized that since memory circuit dies can be used for many different applications, they can be inventoried during manufacture, bumped or not bumped, and used in integrated circuit assemblies at a later stage, thus possibly saving time and reducing costs.

It is preferred that the circuit dies of the integrated circuit assembly have similar coefficients of thermal expansion so as to reduce or minimize the stress created on the physical and electrical interface between them. For example, both circuit dies preferably have similar silicon substrates.

The present invention is applied to integrate precision analog circuit dies to other circuit dies, wherein the analog circuit dies require special isolation from the electrical noise created in the digital logic substrate. The present invention also provides for the mounting of discrete surface mount components onto circuit dies, such as mounting a chip capacitor onto a logic circuit die to bypass a power supply located on the logic circuit die. Further applications include mounting components on components, creating a system on a chip, especially on advanced multiple layer metal (e.g., 5 layers) which can be made to provide room/space for mounting other circuit dies, chips and components.

While the present invention has been described in detail, there are many alternative ways of implementing the methods and apparatuses of the present invention. For example, one or more areas, on one or more sides, of the logic circuit die can be bumped for attaching memory circuit dies, analog circuits/components, or other logic circuit dies. Additionally, it is envisioned that a mix of high-performance circuitry on one die, such as bipolar circuitry, can be combined with high-performance circuitry on a second die, such as CMOS circuitry to create a hybrid integrated circuit for applications such a wireless telephones, and the like. It is therefore intended that the following appended claims be interpreted as including all such alterations, permutations, and equivalents as fall within the true spirit and scope of the present invention.

What is claimed is:

1. An integrated circuit device comprising:
   an integrated circuit assembly including
   (a) a memory circuit die made with a memory circuit fabrication process, said memory circuit die having
      (i) a first plurality of conductive contacts arranged on a first connecting side of said memory circuit die; and
      (ii) a memory circuit formed on said memory circuit die and electrically coupled to said first plurality of conductive contacts; and
   (b) a logic circuit die made with a logic circuit fabrication process, said memory circuit die and said logic circuit die being attached together, said logic circuit die having
      (i) a second plurality of conductive contacts arranged on a second connecting side of said logic circuit die; and
      (ii) a logic circuit formed on said logic circuit die and electrically coupled to said second plurality of connecting contacts;
   wherein said memory circuit die and said logic circuit die are attached together in a flip-chip fashion with said first connecting side in close proximity to said second connecting side and with said first plurality of conductive contacts connected to said second plurality of contacts to provide electrical connections between said memory circuit and said logic circuit, thereby forming a unitary, integrated circuit assembly.

2. The integrated circuit device of claim 1, wherein said first circuit die and said second circuit die are comprised of substrate materials having similar coefficients of thermal expansion such that mechanical stress on said first plurality of contacts and said second plurality of contacts is minimized.

3. The integrated circuit device of claim 1, wherein said memory circuit is a dynamic random access memory.

4. The integrated circuit device of claim 1, wherein said memory circuit is a static random access memory.

5. The integrated circuit device of claim 1, wherein said memory circuit is a flash memory.

6. The integrated circuit device of claim 1 wherein said first connecting side has a greater surface area than said second connecting side.

7. The integrated circuit device of claim 1 wherein said second connecting side has a greater surface area than said first connecting side.

8. The integrated circuit device of claim 1 wherein said first conductive contacts are conductive bumps extending outwardly from said first connecting side.

9. The integrated circuit device of claim 8 wherein said second conductive contacts are pads.

10. The integrated circuit device of claim 1 wherein said second connecting contacts are conductive bumps extending outwardly from said second connecting side.

11. The integrated circuit device of claim 10 wherein said first conductive contacts are pads.

12. The integrated circuit device of claim 1 further comprising:
   (a) an insulating package enclosing said integrated circuit assembly; and
   (b) a plurality of conductive leads electrically coupled to said integrated circuit assembly and extending from said insulating package.

13. The integrated circuit assembly of claim 1 wherein said second connecting contacts are conductive bumps extending outwardly from said second connecting side.

14. A method for creating an integrated circuit device comprising:
   creating an integrated circuit assembly by
   providing a memory circuit die made with a memory circuit fabrication process, said memory circuit die having a first plurality of conductive contacts arranged on a first connecting side of said memory circuit die, and a memory circuit formed on said memory circuit die and electrically coupled to said first plurality of conductive contacts;
   providing a logic circuit die made with a logic circuit fabrication process, said logic circuit die having a second plurality of conductive contacts arranged on a second connecting side of said logic circuit die, and a logic circuit formed on said logic circuit die and electrically coupled to said second plurality of connecting contacts; and
   attaching said memory circuit die and said logic circuit die together in a flip-chip fashion with said first connecting side in close proximity to said second connecting side and with said first plurality of conductive contacts connected to said second plurality of contacts to provide electrical connections between said memory circuit and said logic circuit, thereby forming a unitary, integrated circuit assembly.

15. The method of claim 14 wherein said first circuit die and said second circuit die are comprised of substrate materials having similar coefficients of thermal expansion such that mechanical stress on said first plurality of contacts and said second plurality of contacts is minimized.

16. The method of claim 14, wherein said memory circuit is a dynamic random access memory.

17. The method of claim 14, wherein said memory circuit is a static random access memory.

18. The method of claim 14, wherein said memory circuit is a flash memory.

19. The method of claim 14 wherein said first connecting side has a greater surface area than said second connecting side.

20. The method of claim 14 wherein said second connecting side has a greater surface area than said first connecting side.

21. The method of claim 14 wherein said first conductive contacts are conductive bumps extending outwardly from said first connecting side.

22. The method of claim 21 wherein said second conductive contacts are pads.

23. The method of claim 14 wherein said second connecting contacts are conductive bumps extending outwardly from said second connecting side.

24. The method of claim 23 wherein said first conductive contacts are pads.

25. The method of claim 14 further comprising:

enclosing said integrated circuit assembly within an insulating package; and providing a plurality of conductive leads electrically coupled to said integrated circuit assembly and extending from said insulating package.

26. An integrate circuit assembly comprising:

a first circuit die made with a first circuit fabrication process, said first circuit die having a first plurality of conductive contacts arranged on a first connecting side of said first circuit die;

a second circuit die made with a second circuit fabrication process, said first circuit die and said second circuit die being attached together, said second circuit die having a second plurality of conductive contacts arranged on a second connecting side of said second circuit die; and wherein said first circuit die and said second circuit die are attached together in a flip-chip fashion with said first connecting side in close proximity to said second connecting side and with said first plurality of conductive contacts connected to said second plurality of contacts to provide electrical connections between said first circuit die and said second circuit die, thereby forming a unitary, integrated circuit assembly.

27. The integrated circuit assembly of claim 26 wherein said first circuit die and said second circuit die are comprised of substrate materials having similar coefficients of thermal expansion such that mechanical stress on said first plurality of contacts and said second plurality of contacts is minimized.

28. The integrated circuit assembly of claim 26, wherein said first circuit die includes a dynamic random access memory.

29. The integrated circuit assembly of claim 26, wherein said first circuit die includes a static random access memory.

30. The integrated circuit assembly of claim 26, wherein said first circuit die includes a flash memory.

31. The integrated circuit assembly of claim 26, wherein said first circuit die includes an analog circuit.

32. The integrated circuit assembly of claim 26 wherein said first connecting side has a greater surface area than said second connecting side.

33. The integrated circuit assembly of claim 26 wherein said second connecting side has a greater surface area than said first connecting side.

34. The integrated circuit assembly of claim 33 wherein said second conductive contacts are pads.

35. The integrated circuit assembly of claim 26 wherein said first conductive contacts are conductive bumps extending outwardly from said first connecting side.

36. The integrated circuit assembly of claim 35 wherein said first conductive contacts are pads.

\* \* \* \* \*